United States Patent

Hsu

(10) Patent No.: US 9,601,657 B2
(45) Date of Patent: Mar. 21, 2017

(54) LIGHT-EMITTING DEVICE

(75) Inventor: Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 281 days.

(21) Appl. No.: 13/050,444

(22) Filed: Mar. 17, 2011

(65) Prior Publication Data

US 2012/0235189 A1 Sep. 20, 2012

(51) Int. Cl.
*H01L 33/00* (2010.01)
*H01L 33/02* (2010.01)
H01L 33/38 (2010.01)
H01L 33/10 (2010.01)

(52) U.S. Cl.
CPC .......... *H01L 33/02* (2013.01); *H01L 33/0079* (2013.01); *H01L 33/10* (2013.01); *H01L 33/38* (2013.01); *H01L 33/382* (2013.01); *H01L 33/385* (2013.01)

(58) Field of Classification Search
CPC ..... H01L 33/02; H01L 33/0079; H01L 33/10; H01L 33/38; H01L 33/382; H01L 33/385
See application file for complete search history.

(56) References Cited

U.S. PATENT DOCUMENTS

| | | | |
|---|---|---|---|
| 6,720,586 B1* | 4/2004 | Kidoguchi et al. | 257/103 |
| 7,811,845 B2 | 10/2010 | Hsu et al. | |
| 2005/0257824 A1* | 11/2005 | Maltby et al. | 136/252 |
| 2006/0125985 A1 | 6/2006 | Chen | |
| 2006/0176924 A1* | 8/2006 | Kim | H01S 5/024 372/50.11 |
| 2006/0289875 A1* | 12/2006 | Shieh et al. | 257/79 |
| 2007/0085944 A1* | 4/2007 | Tanaka | G02F 1/133603 349/69 |
| 2007/0217460 A1* | 9/2007 | Ishibashi | B82Y 20/00 372/45.01 |
| 2007/0274360 A1* | 11/2007 | Inoue et al. | 372/49.01 |
| 2008/0042155 A1* | 2/2008 | Furuta et al. | 257/98 |
| 2008/0073659 A1* | 3/2008 | Tamura et al. | 257/97 |
| 2008/0088932 A1 | 4/2008 | Cho et al. | |
| 2008/0169479 A1* | 7/2008 | Xu et al. | 257/94 |
| 2008/0283819 A1* | 11/2008 | Konno | 257/13 |
| 2009/0050909 A1* | 2/2009 | Chen | H01L 33/44 257/88 |
| 2009/0145476 A1* | 6/2009 | Fetzer et al. | 136/256 |
| 2009/0294784 A1* | 12/2009 | Nakahara et al. | 257/98 |

(Continued)

FOREIGN PATENT DOCUMENTS

CN 1812146 A 8/2006
CN 101271949 A 9/2008

(Continued)

*Primary Examiner* — Su C Kim
(74) *Attorney, Agent, or Firm* — Muncy, Geissler, Olds & Lowe, P.C.

(57) ABSTRACT

This disclosure discloses a light-emitting device. The light-emitting device comprises: a substrate; an intermediate layer formed on the substrate; a transparent bonding layer; a first semiconductor window layer bonded to the semiconductor layer through the transparent bonding layer; and a light-emitting stack formed on the first semiconductor window layer. The intermediate layer has a refractive index between the refractive index of the substrate and the refractive index of the first semiconductor window layer.

16 Claims, 14 Drawing Sheets

(56) References Cited

U.S. PATENT DOCUMENTS

| | | |
|---|---|---|
| 2010/0006862 A1 | 1/2010 | Cheng |
| 2010/0012968 A1* | 1/2010 | Yahata et al. .................... 257/99 |
| 2010/0133507 A1* | 6/2010 | Takao et al. .................... 257/13 |
| 2010/0252103 A1 | 10/2010 | Yao et al. |
| 2010/0264445 A1* | 10/2010 | Niki et al. ...................... 257/98 |

FOREIGN PATENT DOCUMENTS

| | | |
|---|---|---|
| TW | 200640032 | 11/2006 |
| TW | 200950127 A | 12/2009 |
| TW | 201041437 A | 11/2010 |

\* cited by examiner

LIGHT-EMITTING DEVICE

BACKGROUND

1. Technical Field

The present disclosure relates to a light-emitting device, and in particular to a light-emitting device comprising an intermediate layer which is bonded to a substrate through a transparent bonding layer and which has a refraction index between the refractive index of the substrate and the refractive index of a semiconductor window layer.

2. Description of the Related Art

The light-emitting diodes (LEDs) of the solid-state lighting elements have the characteristics of the low power consumption, low heat generation, long operational life, shockproof, small volume, quick response and good optoelectrical property like light emission with a stable wavelength, so the LEDs have been widely used in household appliances, indicator light of instruments, and opto-electrical products, etc.

Recently, a light-emitting device with a flip-chip package structure having light emitted toward the substrate is developed. However, how to improve the light-emitting efficiency of the light-emitting device is still an important issue in this art.

SUMMARY OF THE DISCLOSURE

The present disclosure provides a light-emitting device.

The light-emitting device comprises: a substrate; an intermediate layer formed on the substrate; a transparent bonding layer; a first semiconductor window layer bonded to the semiconductor layer through the transparent bonding layer; and a light-emitting stack formed on the first semiconductor window layer. The intermediate layer has a refractive index between the refractive index of the substrate and the refractive index of the first semiconductor window layer.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
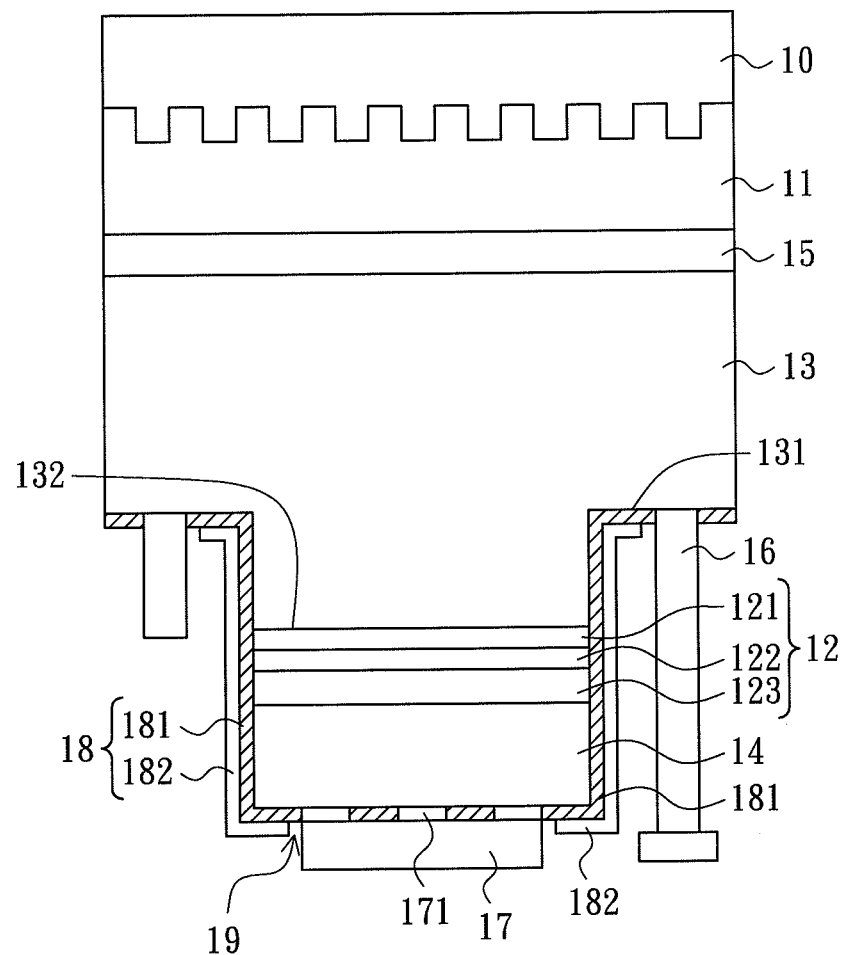
FIG. 1 shows a cross-sectional view of a light-emitting device in accordance with the first embodiment of the present disclosure.

FIG. 1 discloses a light-emitting device 100 according to the first embodiment of the present disclosure. The light-emitting device 100 comprises a permanent substrate 10, an intermediate layer 11 formed on the permanent substrate 10, a transparent bonding layer 15, a first semiconductor window layer 13 bonded to the intermediate layer 11 through the transparent bonding layer 15, a light-emitting stack 12 formed on the first semiconductor window layer 13, a second semiconductor window layer 14 formed on the light-emitting stack 12 opposite to the first semiconductor window layer 13. In this embodiment, the intermediate layer 11 has a refractive index between the refractive index of the permanent substrate 10 and the refractive index of the first semiconductor window layer 13. For example, the permanent substrate 10 is a sapphire substrate having the refractive index of 1.7, the intermediate layer 11 comprises gallium nitride or diamond having the refractive index of 2.4, and the first semiconductor window layer 13 is gallium phosphide (GaP) having the refractive index of 3.37. Since the refractive index is gradually reduced from the first semiconductor window layer 13 to the permanent substrate 10, the total light reflection in the light-emitting device 100 can be attenuated. In one embodiment, the permanent substrate 10 has the refractive index ranging from 2.4 to 3.4, the intermediate layer 11 has the refractive index ranging from 1.7 to 3.4, and the first semiconductor window layer 13 has the refractive index ranging from 1.4 to 1.7. In addition, the permanent substrate 10 is a patterned substrate for improving light efficiency of the light-emitting stack 12. Alternatively, the permanent substrate 10 can have a flat surface. In one embodiment, when the permanent substrate 10 has a flat surface, the intermediate layer 11 can comprises a plurality of pores formed therein so as to form a porous structure (not shown) for scattering light. The pores are formed by dry etching such as inductive coupling plasma (ICP), or wet etching using potassium hydroxide, oxalic acid, sulfuric-acid, phosphoric acid or combinations thereof.

Referring to FIG. 1, the first semiconductor window layer 13 comprises a recess portion 131 and a flat surface 132. The light-emitting stack 12 is formed on the flat surface 132. The light-emitting device 100 further comprises a plurality of patterned contacts 171 formed on the second semiconductor window layer 14 for spreading current. In addition, the light-emitting device 100 further comprises a mirror layer 18. In this embodiment, the mirror layer 18 comprises an insulation layer 181 for preventing undesired current path, and a reflective layer 182 formed on portions of the insulation layer 181 for reflecting the light toward the first semiconductor window layer 13. The insulation layer 181 covers a side surface and the recess portion 131 of the first semiconductor window layer 13, and further covers side walls of the light-emitting stack 12 and the second semiconductor window layer 14. Moreover, the insulation layer 181 is also formed on the second semiconductor window layer 14, but not formed on the contacts 171. The light-emitting device 100 further comprises a first electrode 16 formed on the recess portion 131 of the first semiconductor window layer 13, and a second electrode 17 formed on the patterned contacts 171 and portions of the insulation layer 181 for electrically connecting to the light-emitting stack 12 for emitting light. A gap 19 is formed between the reflective layer 182 and the second electrode 17. The insulation layer 181 comprises oxide such as $SiO_2$, $Ta_2O_5$, $TiO_2$, $Al_2O_3$, nitride such as $Si_3N_4$, AlN, or polymer. The reflective layer 182 comprises metal, such as Al, Ag, Au or Cu. Alternatively, the insulation layer 181 and the reflective layer 182 can comprise a multi-layer structure. Moreover, the mirror layer 18 can merely comprise the insulation layer 181 having a multi-layer structure, such as distributed Bragg reflectors (DBR).

In this embodiment, the first semiconductor window layer 13 has a layer thickness greater than that of the second semiconductor window layer 14. The greater the thickness of the first semiconductor window layer 13, the easier the light escape from the light-emitting device 100 would be. In one embodiment, the first semiconductor window layer 13 has a layer thickness ranging from 1.2 μm to 10 μm. The second semiconductor window layer 14 has a layer thickness ranging from 0.1 μm to 5 μm.

In this embodiment, the light-emitting stack 12 comprises a p-type semiconductor layer 121, an active layer 122, and an n-type semiconductor layer 123. Each of the p-type semiconductor layer 121, the active layer 122, and the n-type semiconductor layer 123 comprises group III-V compound semiconductor, such as GaN based material or GaP based material. The permanent substrate 10 is transparent and comprises glass, sapphire, or quartz. The transparent bonding layer 15 comprises indium tin oxide (ITO), benzocyclobutene (BCB), epoxy resin (Epoxy), polydimethylsiloxane (PDMS), silicone ($SiO_x$), aluminum oxide ($Al_2O_3$), titanium dioxide ($TiO_2$), silicon nitride ($SiN_x$), or combinations thereof. The transparent bonding layer 15 can comprises a multi-layer structure and have a thickness ranging from 10 nm to 5 μm.

It is noted that the intermediate layer 11 can be bonded to the first semiconductor window layer 13 by a direct bonding without the transparent bonding layer 15. The direct bonding is performed under a temperature of 200-500° C. and a pressure less than 1 mtorr, and a composite material is formed at the interface between the intermediate layer 11 and the first semiconductor window layer 13 during the direct bonding process.

FIGS. 2A to 2D disclose a light-emitting device 200 according to the second embodiment of the present disclosure. The light-emitting device 200 of the second embodiment has the similar structure with the light-emitting device 100 of the first embodiment except that the mirror layer 18 further comprises a layer 183 formed on the second semiconductor window layer 14 and the contacts 171. The second electrode 17 is formed on the layer 183. Since the contacts 171 ohmicly contact the second semiconductor window layer 14, when a voltage is applied on the second electrode 17, most current flows through the contacts 171 to the second semiconductor window layer 14 for spreading current. The insulation layer 181 and the reflective layer 182 are merely formed on the side wall of the light-emitting stack 12 and the first and second semiconductor window layers 13, 14. The contacts 171 contain metal such as Cu, Al, In, Sn, Au, Pt, Zn, Ag, Ti, Ni, Pb, Pd, Ge, Ni, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ge—Au, Be—Au, Cr—Au, Ag—Ti, Cu—Sn, Cu—Zn, Cu—Cd, Sn—Pb—Sb, Sn—Pb—Zn, Ni—Sn, Ni—Co, or Au alloy.

Figure 2A:
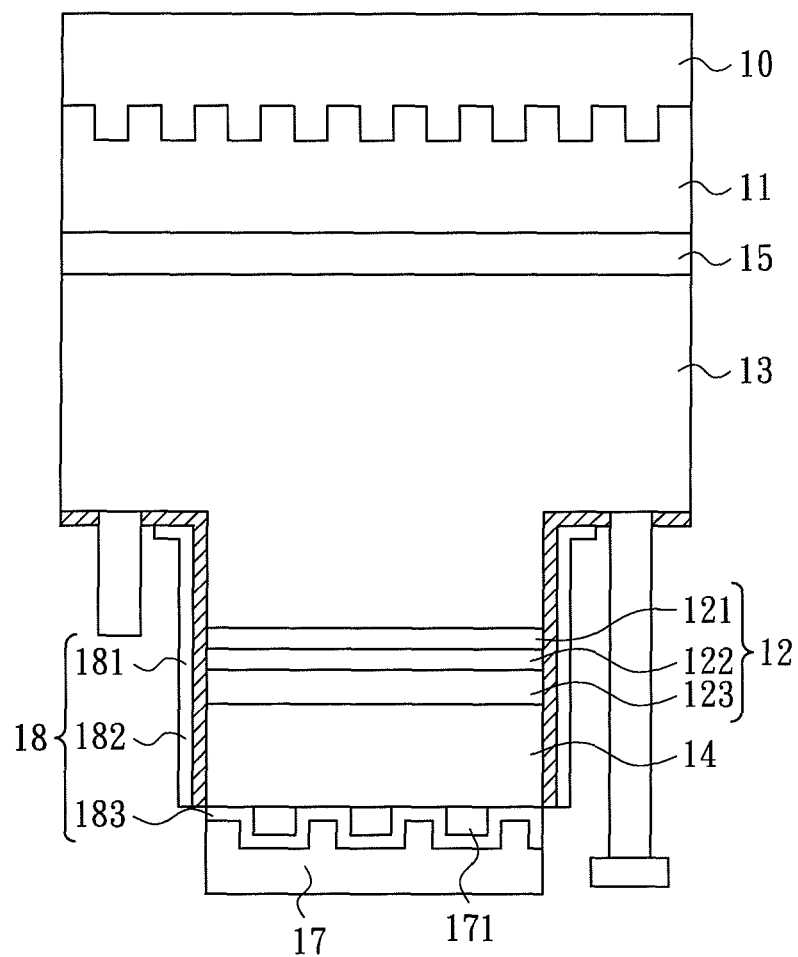
FIGS. 2A to 2D show a cross-sectional view of a light-emitting device in accordance with the second embodiment of the present disclosure.
Figure 2B:
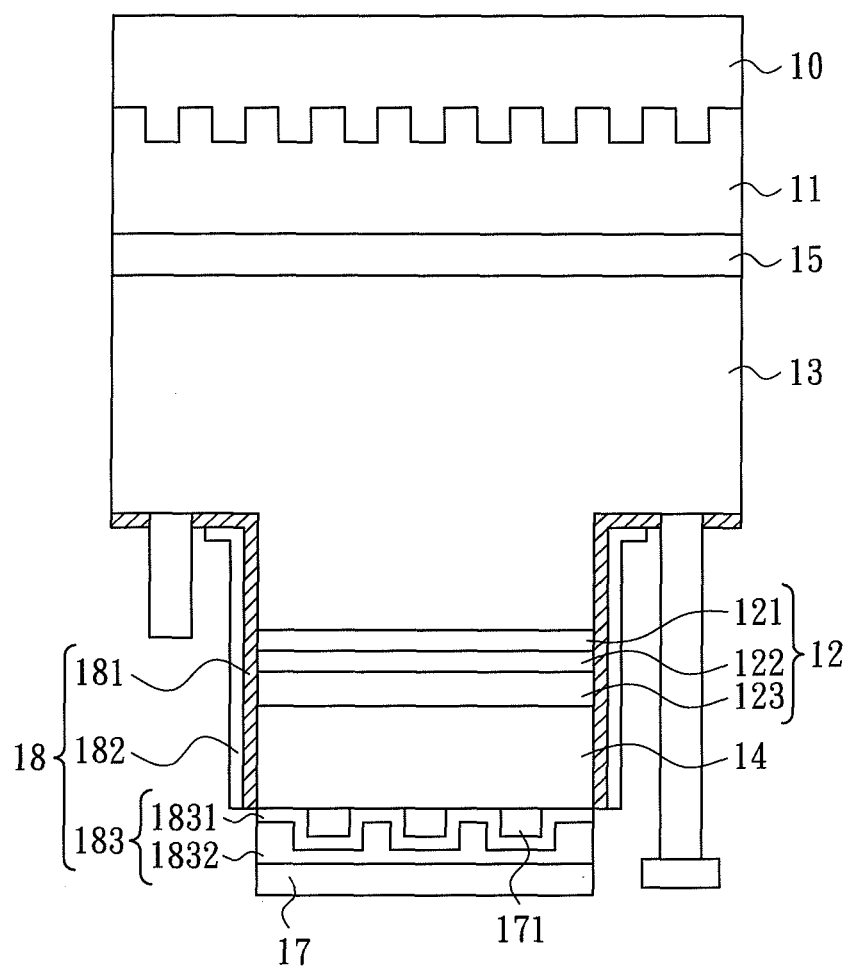
Figure 2C:
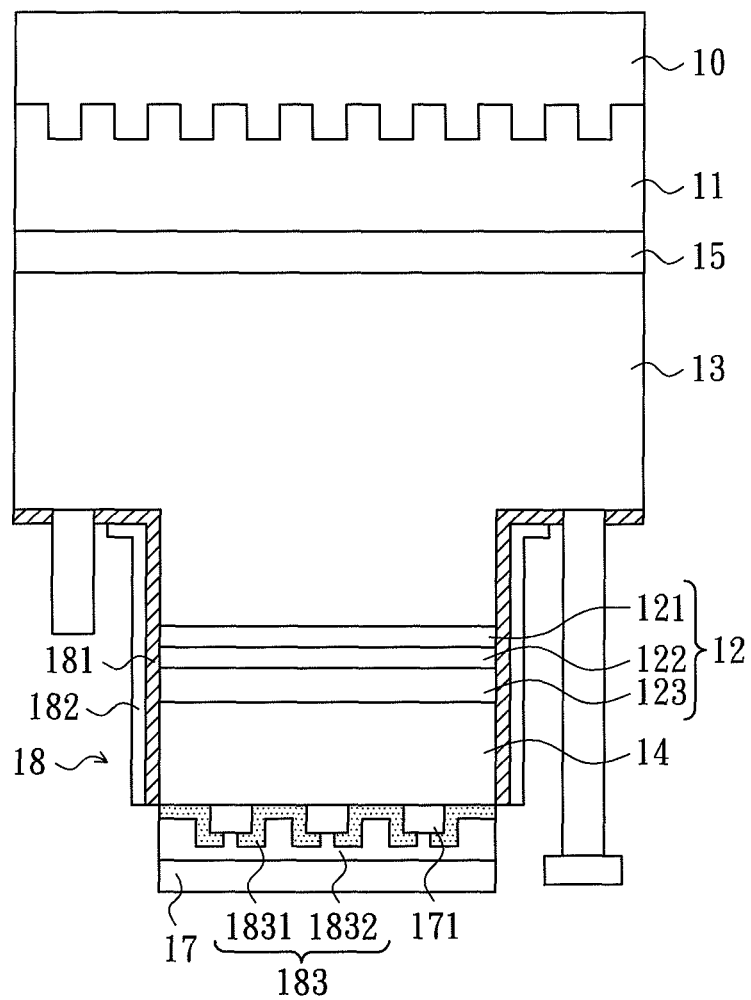
Figure 2D:
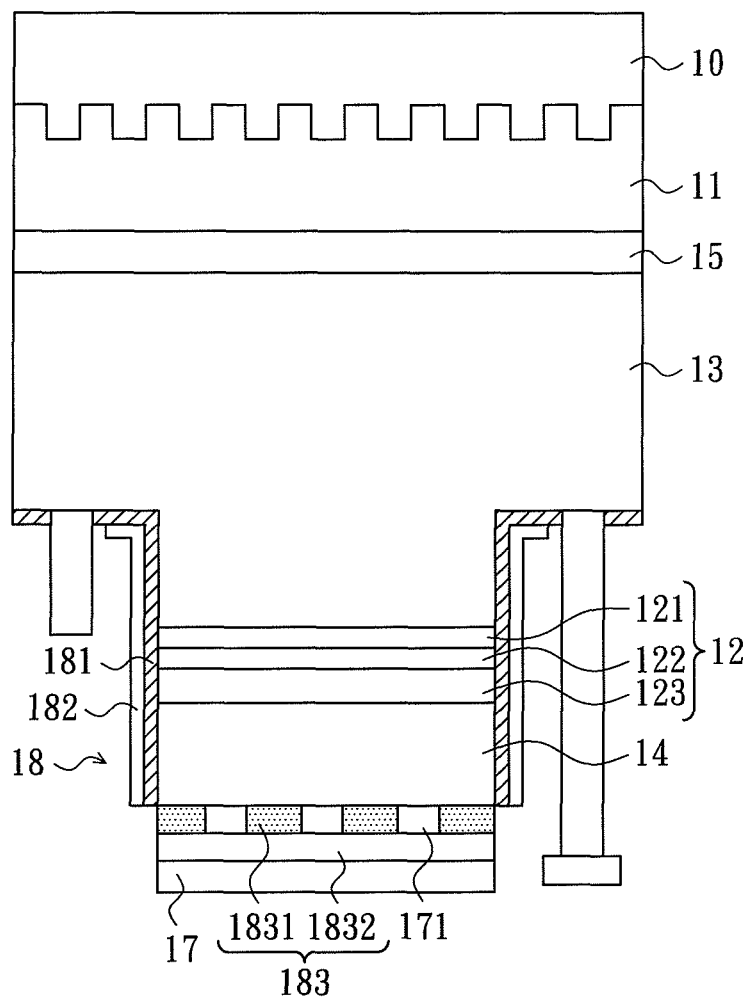

Referring to FIG. 2A, the layer 183 is made of metal comprising Au, Ni, Cu, Ag, or Al. Referring to FIGS. 2B to 2D, the layer 183 can be an omni-directional reflector (ODR) structure comprising a first layer 1831 and a second layer 1832. Referring to FIG. 2B, the first layer 1831 is formed on the second semiconductor window layer 14 and the contacts 171, and the material of the first layer 1831 is ITO. The second layer 1832 of Ag is formed on the ITO layer. Alternatively, the first layer 1831 can be directly formed on the second window semiconductor layer 14 without formation of the contacts 17 therebetween for ohmicly contacting with the second window semiconductor layer 14. Referring to FIG. 2C, the first layer 1831 is formed on the second semiconductor window layer 14 and portions of the contacts 171 wherein the material of the first layer 1831 is $SiO_2$. The second layer 1832 comprising Ag, Al or Cu is formed on the $SiO_2$ layer and the contacts 171 uncovered by the $SiO_2$ layer for electrically connecting with second semiconductor window layer 14 through the contacts 171. Referring to FIG. 2D, the first layer 1831 of $SiO_2$ is formed on the second semiconductor window layer 14 and flush with the contacts 171. The second layer 1832 is formed on the $SiO_2$ layer.

Figure 3:
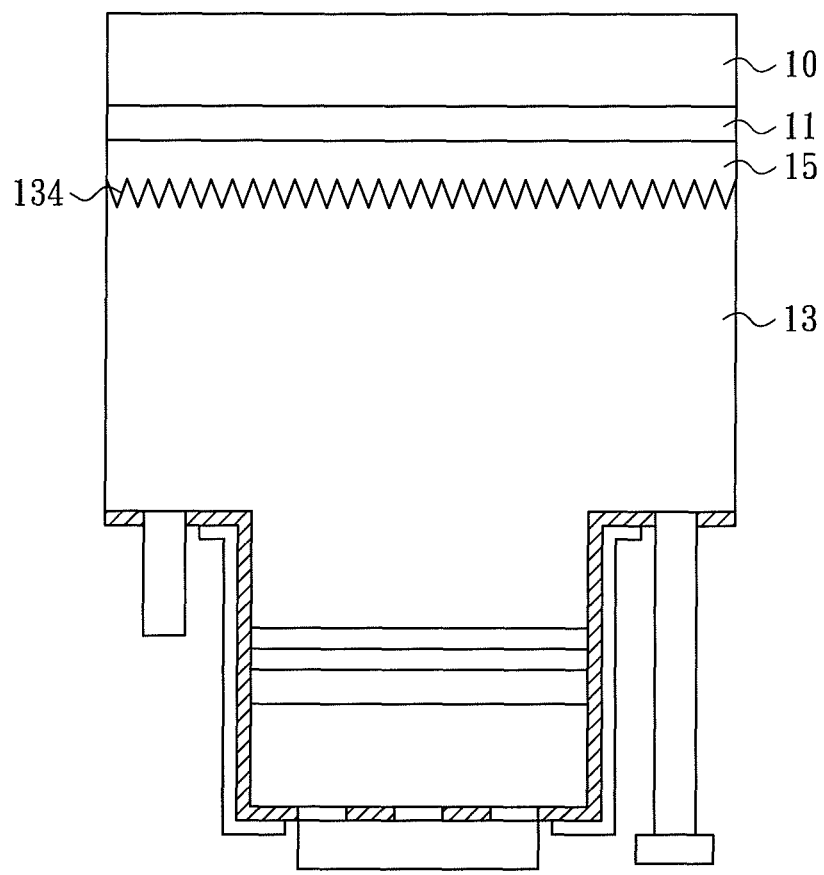
FIG. 3 shows a cross-sectional view of a light-emitting device in accordance with the third embodiment of the present disclosure.

FIG. 3 discloses a light-emitting device 300 according to the third embodiment of the present disclosure. The light-emitting device 300 of the third embodiment has the similar structure with the light-emitting device 100 of the first embodiment except that the first semiconductor window layer 13 has a scattering surface 134 facing toward the permanent substrate 10 for scattering the light emitted from the light-emitting stack 12. The permanent substrate 10 has a flat surface. The scattering surface 134 can be formed by surface texturing or doping. The surface texturing can be performed by etching.

Figure 4:
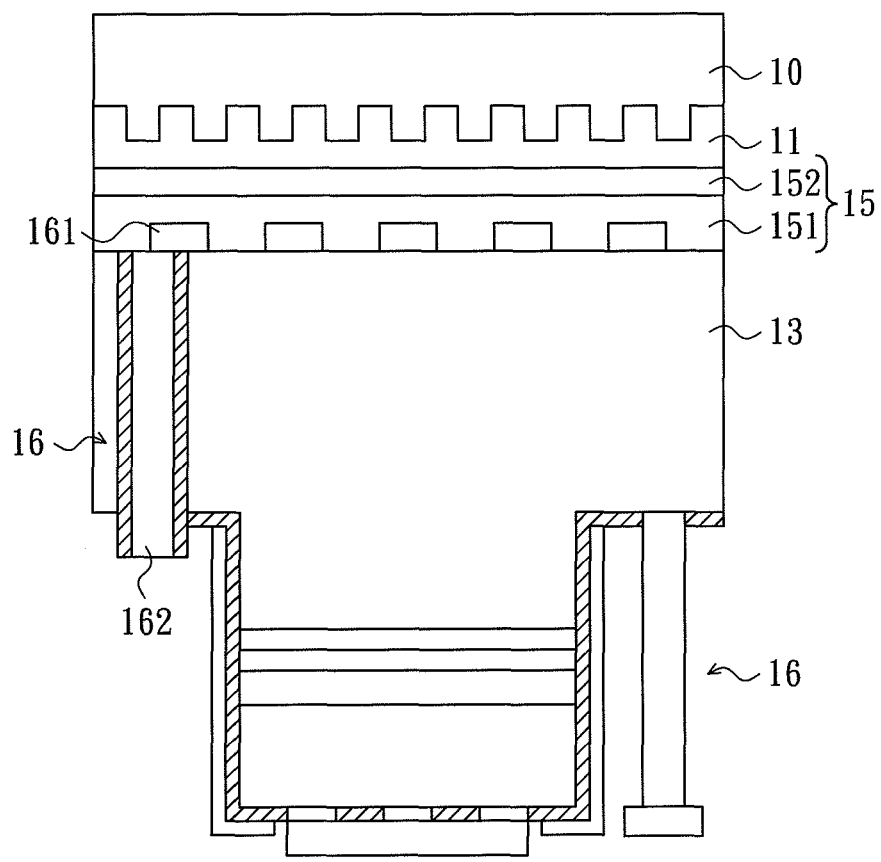
FIG. 4 shows a cross-sectional view of a light-emitting device in accordance with the fourth embodiment of the present disclosure.

FIG. 4 discloses a light-emitting device 400 according to the fourth embodiment of the present disclosure. The light-emitting device 400 of the fourth embodiment has the similar structure with the light-emitting device 100 of the first embodiment except that the light-emitting device 400 further comprises a plurality of ohmic contact parts 161 formed between the transparent bonding layer 15 and the first semiconductor window layer 13 for uniformly spreading current. Moreover, the first electrode 16 has a finger electrode 162 extending through the first semiconductor window layer 13 for electrically connecting with one of the ohmic contact parts 161. In this embodiment, the ohmic contact parts 161 are spaced apart from each other, and the transparent bonding layer 15 comprises a transparent conductive layer 151 such as indium titanium oxide (ITO) covering the ohmic contact parts 161 for electrical connection therebetween. The transparent bonding layer 15 further comprises a transparent layer 152 comprising indium titanium oxide (ITO), silicon oxide ($SiO_2$), or aluminum oxide ($Al_2O_3$). The ohmic contact parts 161 comprises metal such as Ge, Au, Ni, Cu, or combinations thereof.

Figure 5:
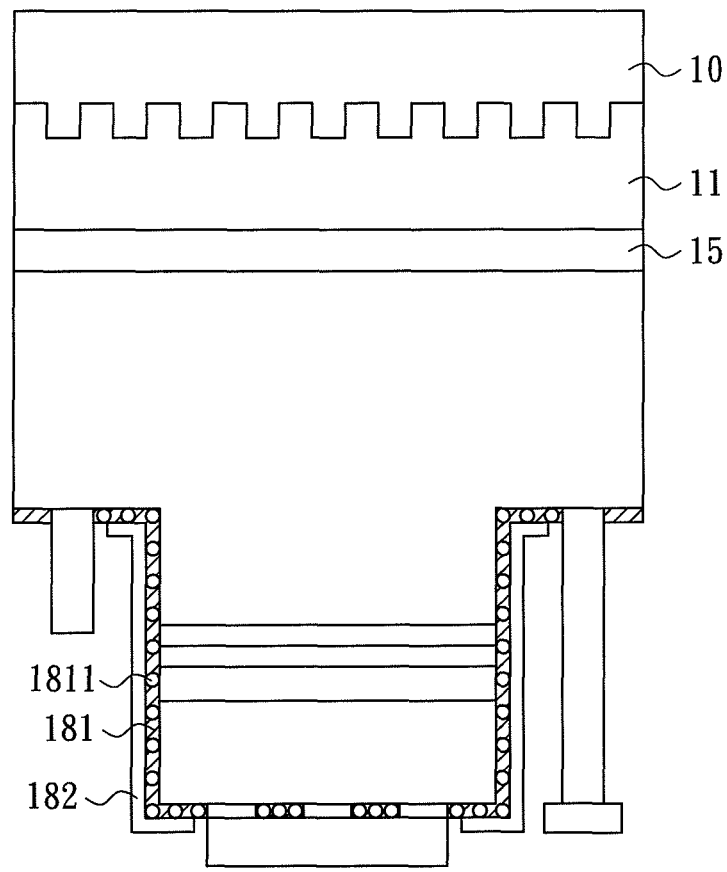
FIG. 5 shows a cross-sectional view of a light-emitting device in accordance with the fifth embodiment of the present disclosure.

FIG. 5 discloses a light-emitting device 500 according to the fifth embodiment of the present disclosure. The light-emitting device 500 of the fifth embodiment has the similar structure with the light-emitting device 100 of the first embodiment except that the insulation layer 181 comprises a plurality of particles 1811 dispersed therein for providing a curved surface such that light refraction occurs at the curved surface to change a light-emitting angle. Each of the particles 1811 has a diameter ranging from 0.3 μm to 5 μm. The particles 1811 comprise glass, polymer, or ceramic material. The transparent bonding layer 15 can also comprises the particles for scattering light. The particles 1811 are formed within the insulation layer 181 by a spin-on process a printing process, or a dipping process.

Figure 6:
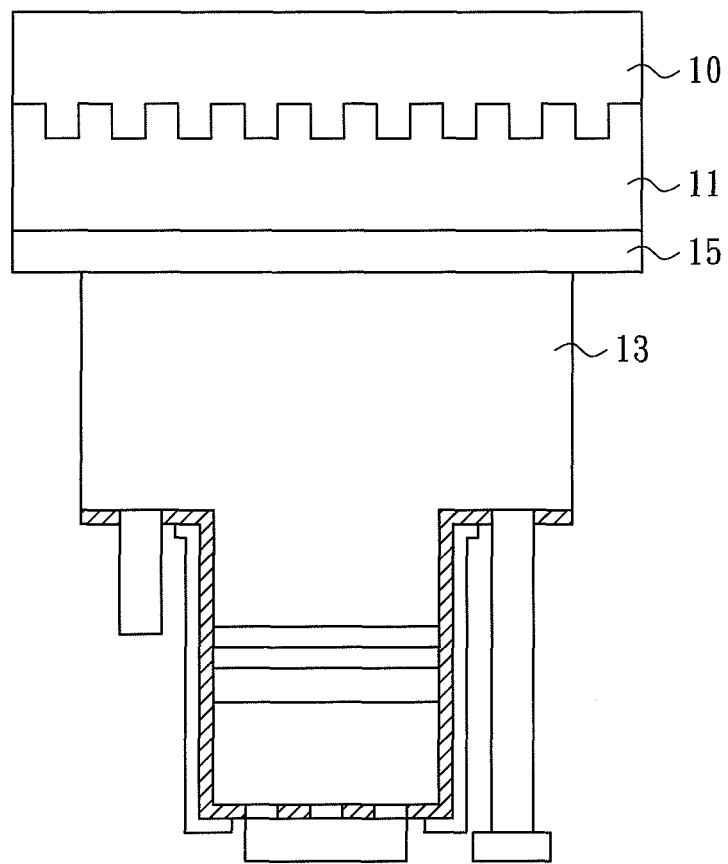
FIG. 6 shows a cross-sectional view of a light-emitting device in accordance with the sixth embodiment of the present disclosure.

FIG. 6 discloses a light-emitting device 600 according to the sixth embodiment of the present disclosure. The light-emitting device 600 of the sixth embodiment has the similar structure with the light-emitting device 400 of the first embodiment except that the first semiconductor window layer 13 has a smaller area than that of the transparent bonding layer 15. Accordingly, there is no by-product formed on the first semiconductor window layer 13 which is produced from separating a plurality of the light-emitting diodes into an individual chip by laser, thereby improving light efficiency.

Figure 7A:
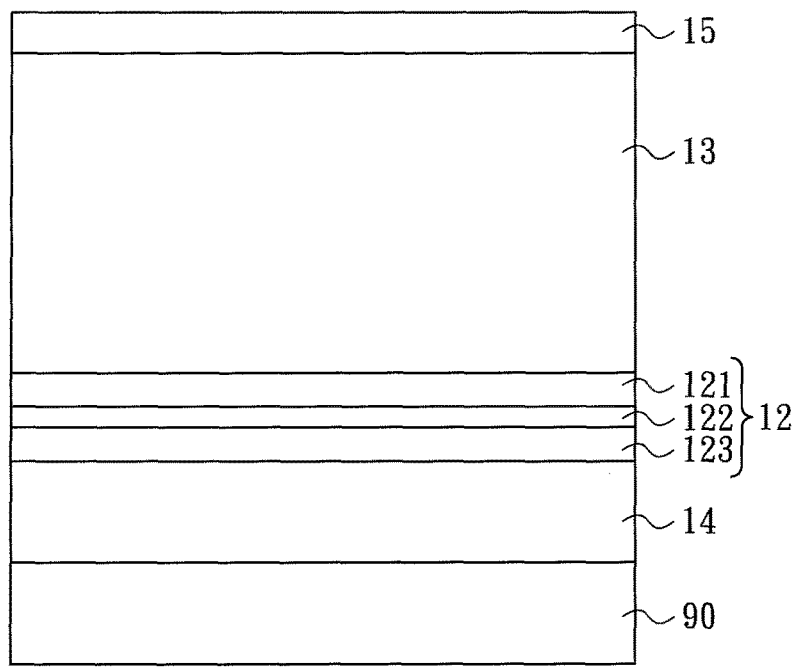
FIGS. 7A to 7F are cross-sectional views showing a method of making the light-emitting device in accordance with the first embodiment of the present disclosure.

FIGS. 7A to 7G illustrate a method of making the light-emitting device 100 according to the first embodiment of the present disclosure. Referring to FIG. 7A, the second semiconductor window layer 14 of AlGaInP and the light-emitting stack 12 comprising the n-type semiconductor layer 123, and the active layer 122, the p-type semiconductor layer 121 are sequentially grown on a growth substrate 90. Subsequently, the first semiconductor window layer 13 of GaP is formed on the p-type semiconductor layer 121, and the transparent bonding layer 15 comprising a bilayer structure of $SiO_2$ and $Al_2O_3$ is formed on the first semiconductor window layer 13. The growth substrate 90 comprises sapphire, silicon carbide, gallium nitride, gallium aluminum, and combinations thereof.

Figure 7B:
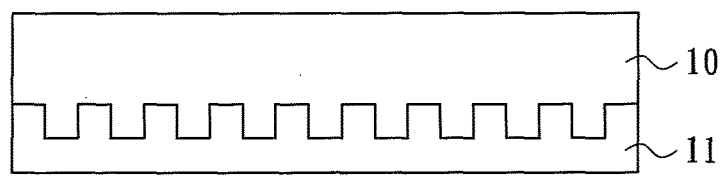

Referring to FIG. 7B, the permanent substrate 10 is provided for growing the intermediate layer 11 of GaN thereon. Before the growth of the intermediate layer 11, the permanent substrate 10 is etched to form a patterned substrate.

Figure 7C:
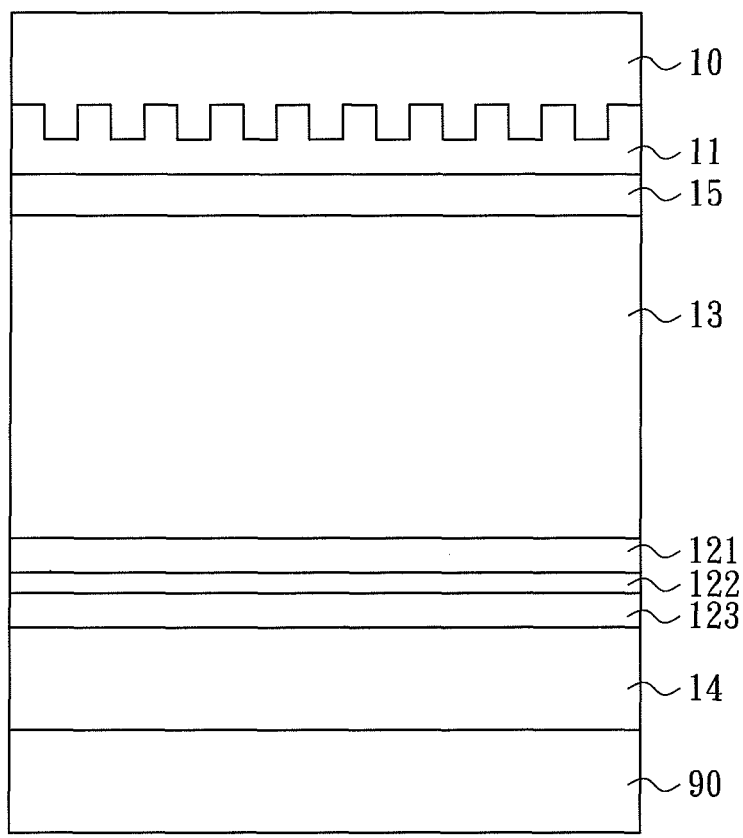

Referring to FIG. 7C, the intermediate layer 11 is bonded to the first semiconductor window layer 13 through the transparent bonding layer 15.

Figure 7D:
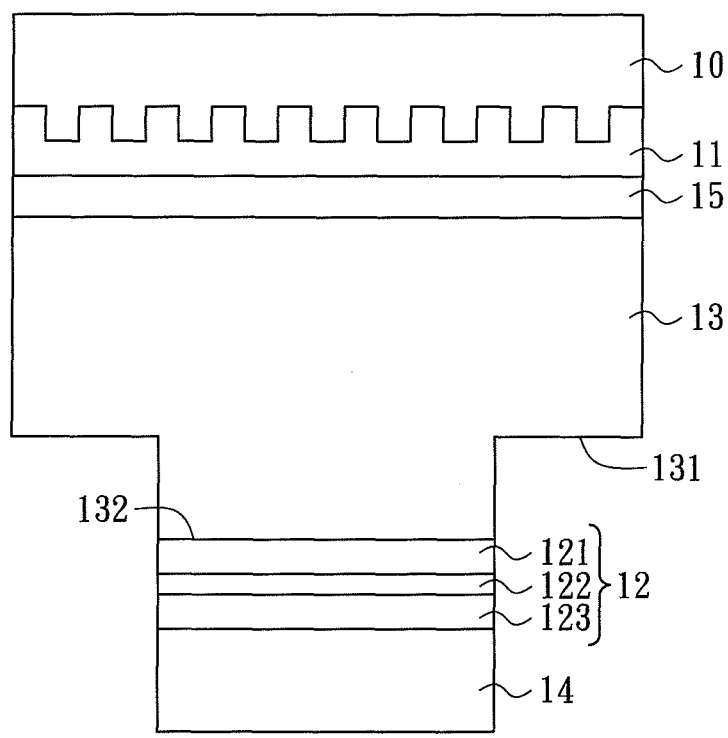

Referring to FIG. 7D, after removing the growth substrate 90, portions of the n-type semiconductor layer 123, the active layer 122, the p-type semiconductor layer 121, and the second semiconductor window layer 14 are removed to expose the first semiconductor window layer 13. Furthermore, portions of the first semiconductor window layer 13 are removed to form a recess portion 131 and a flat surface 132 on which the light-emitting stack 12 and the second semiconductor window layer 14 are formed.

Figure 7E:
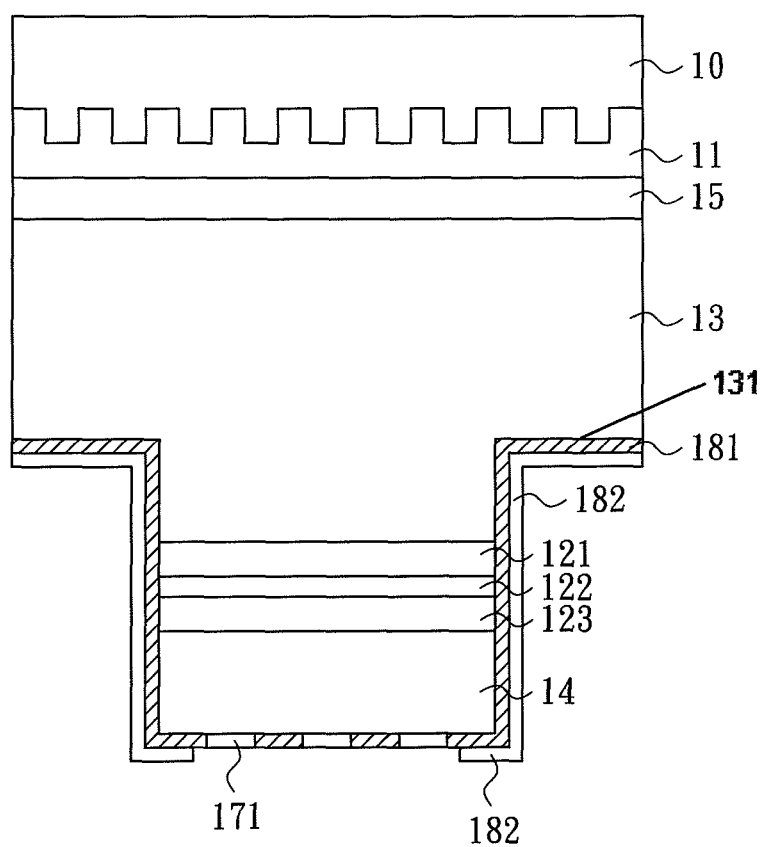

Referring to FIG. 7E, a plurality of patterned contacts 171 are formed on the second window semiconductor layer 14. Subsequently, the insulation layer 181 is formed to cover side walls of the light-emitting stack 12 and the first semiconductor window layer 13, and further to cover the recess portion 131 of the first semiconductor window layer 13 and the second semiconductor window layer 14, but not to cover the contacts 171. The reflective layer 182 is formed on portions of the insulation layer 181.

Figure 7F:
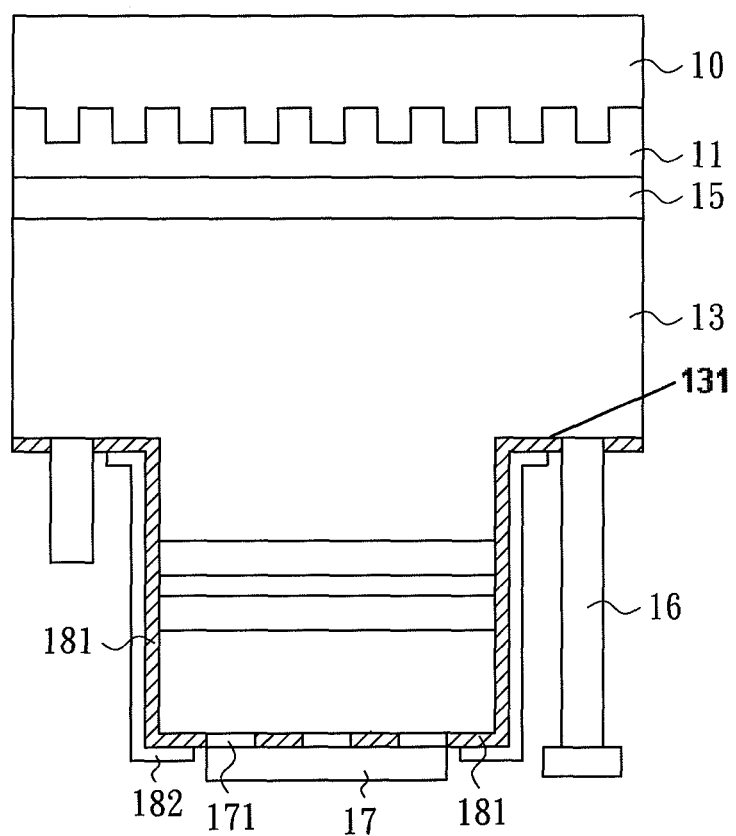

Referring to FIG. 7F, portions of the insulation layer 181 and the reflective layer 182 formed on the recess portion 131 of the first semiconductor window layer 13 are removed to expose parts of the first semiconductor window layer 13. The first electrode 16 is formed on the exposed first semiconductor window layer 13, and the second electrode 17 is formed on the contacts 171 and portions of the insulation layer 180.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a substrate having a first refractive index, a top surface, and a bottom surface;
   an intermediate layer formed on the bottom surface and having a second refractive index;
   a first semiconductor layer comprising a third refractive index and a side wall;
   a transparent bonding layer formed between the intermediate layer and the first semiconductor layer, and comprising a material absent in the intermediate layer and the first semiconductor layer;
   an ohmic contact part formed between the transparent bonding layer and the first semiconductor layer;
   a light-emitting stack formed on a surface of the first semiconductor layer opposite to the substrate and configured to emit a light passing through the top surface; and
   a first electrode formed on a recess portion of the first semiconductor layer, wherein in a cross-sectional view of the light-emitting device, the first electrode has two parts and the light-emitting stack is arranged between the two parts of the first electrode,
   wherein the second refractive index is between the first refractive index and the third refractive index.

2. The light-emitting device of claim 1, further comprising a second semiconductor layer thinner than the first semiconductor layer.

3. The light-emitting device of claim 1, wherein one of the two parts of the first electrode penetrating the first semiconductor layer and electrically connected to the ohmic contact part.

4. The light-emitting device of claim 1, further comprising:
   an insulating layer on the light-emitting stack and the first semiconductor layer; and
   a reflective layer formed on the insulating layer.

5. The light-emitting device of claim 1, wherein the intermediate layer comprises gallium nitride.

6. The light-emitting device of claim 2, further comprising a second electrode formed on the second semiconductor layer.

7. The light-emitting device of claim 6, further comprising a plurality of contacts formed between the second electrode and the second semiconductor layer.

8. The light-emitting device of claim 7, further comprising a metal layer formed between the contacts and the second electrode.

9. The light-emitting device of claim 1, wherein the first semiconductor layer comprises a scattering surface formed by surface texturing and configured to scatter light to pass through the top surface.

10. The light-emitting device of claim 4, wherein the insulating layer comprises a plurality of particles dispersed therein.

11. The light-emitting device of claim 1, wherein the intermediate layer comprises a porous structure.

12. The light-emitting device of claim 4, further comprising a plurality of contacts arranged on a position not covered by the insulating layer.

13. The light-emitting device of claim 1, further comprising a reflective layer formed on the side wall of the first semiconductor layer and on a side wall of the light-emitting stack.

14. The light-emitting device of claim 1, wherein the bottom surface is with a patterned portion.

15. The light-emitting device of claim 12, wherein a top surface of the insulating layer and a top surface of one of the contacts are substantially coplanar.

16. The light-emitting device of claim 5, wherein the first semiconductor layer comprises GaP.

* * * * *